June 2, 1970 H. M. MANASEVIT 3,515,576

SINGLE CRYSTAL SILICON ON BERYLLIUM OXIDE

Filed Jan. 26, 1966 2 Sheets-Sheet 1

INVENTOR.
HAROLD M. MANASEVIT

BY Robert G. Rogers

ATTORNEY

SINGLE CRYSTAL SILICON ON BERYLLIUM OXIDE

Filed Jan. 26, 1966 2 Sheets-Sheet 2

INVENTOR.
HARRY H. MANASEVIT
BY Robert G. Rogers
ATTORNEY

United States Patent Office 3,515,576
Patented June 2, 1970

3,515,576

SINGLE CRYSTAL SILICON ON BERYLLIUM OXIDE

Harold M. Manasevit, Anaheim, Calif., assignor to North American Rockwell Corporation, a corporation of Delaware Filed Jan. 26, 1966, Ser. No. 523,217
Int. Cl. C23c *11/06*
U.S. Cl. 117—106 7 Claims

ABSTRACT OF THE DISCLOSURE

This invention is directed to a composite structure comprising a substrate of single crystal beryllium oxide and a film of single crystal silicon epitaxially disposed atop said substrate.

This invention relates to composites of thin crystalline films upon beryllium oxide substrates and more particularly in a specific embodiment of the invention to epitaxial single crystalline silicon on crystalline beryllium oxide.

The composites of this invention are useful in the technology of translating devices, e.g., lasers, transistors, rectifiers, resistors, and diodes. Microelectronic circuits have been produced heretofore from composites of crystalline silicon upon substrates which are semiconductors, e.g., silicon upon silicon and from silicon on insulating substrates, e.g., silicon on crystalline alpha-aluminum oxide. In the case of a composite of a film of crystalline silicon on a semiconducting substrate, to form the film into electrically isolated components for a circuit it is necessary to resort to reverse biasing methods. In the case of silicon on alpha-aluminum oxide, the substrate is electrically insulated, but for certain uses it does not have the power dissipation capability required.

The characterizing feature of this invention is a composite of crystalline silicon grown upon an electrically insulating substrate of beryllium oxide which has high heat dissipation capabilities. The silicon film may be divided into circuit componets by chemical or mechanical etching through the film down to the substrate. Impregnating the film or the separated areas of the film with acceptor or donor impurities converts the separated areas upon proper delineating and sequencing of masking and diffusion steps into the various components of microminiaturized electronic circuitry, including diodes, transistors, resistors, and capacitors. As a result, both active and passive components can be fabricated. This technique provides complete and positive electrical isolation of the components from each other by virtue of the fact that the substrate is insulating. The electrical isolation characteristics of the invention eliminates the necessity of reverse biasing which may (1) inhibit the speed of diode switches, (2) limit the range of useful frequencies, (3) restrict the amount of power that may be impressed upon or dissipated by the circuit.

The invention also eliminates other undesirable intercomponent electrical effects such as resistive or capacitive coupling. The high thermal conductivity of the substrate enables the material to be used effectively as heat sinks for the circuits at both high and low temperature ranges. Crystalline alpha-aluminum oxide also has relatively high thermal conductivity but does not have the heat dissipation capabilities of beryllium oxide.

Therefore, it is an object of this invention to provide a composite into which can be formed electrically isolated silicon components which are electrically insulated from each other on a high heat conducting substrate.

It is still another object of this invention to provide an improved heat conducting and electrically insulating substrate for components formed in silicon films deposited on the substrate.

It is still a further object of this invention to provide a substrate material having electrical insulating and improved high thermal conductivity characteristics over those presently available for epitaxial films, particularly silicon.

These and other objects of the invention will become more apparent in connection with the following description and drawings of which:

FIG. 1 is a representation of a composite of this invention shown in section on a greatly enlarged scale.

FIG. 2*a* is a pyramid representation of one natural facet of beryllium oxide.

FIG. 2*b* is a prism representation of a second natural facet of beryllium oxide.

FIG. 2*c* is a platelet representation of a third natural facet of beryllium oxide.

Figure 1:
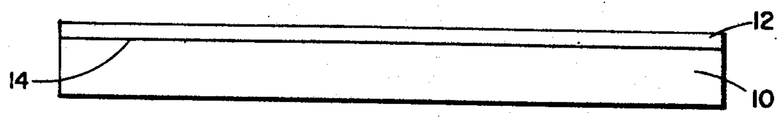

Referring now to FIG. 1, reference numeral 10 designates a substrate of crystalline beryllium oxide with a film 12 of single crystal silicon epitaxially grown upon the substrate such that the film is joined to the substrate by chemical bonds. The surface of the beryllium oxide upon which the film 12 is joined, i.e., at the interface of substrate 10 and the film 12, is designated by reference numeral 14.

Figure 2A:
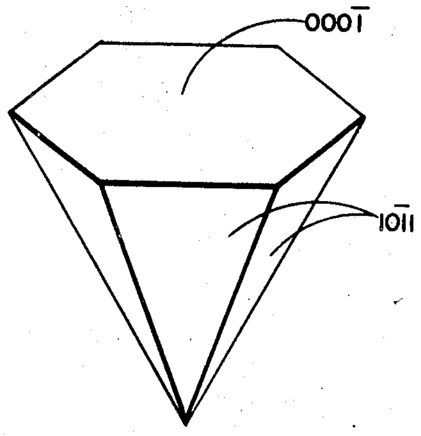
Figure 2C:
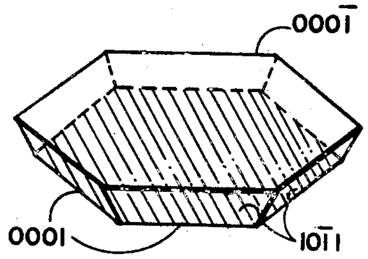
Figure 2B:
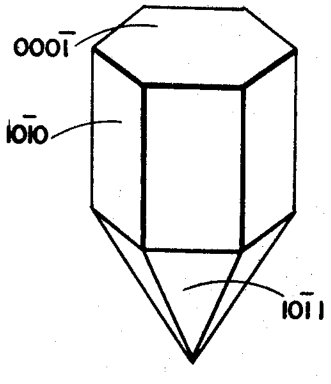

Referring now to FIGS. 2*a*, *b*, and *c*, wherein is shown beryllium oxide crystals in the form of a pyramid, prism, and platelet having deposition planes illustrated. FIG. 2*a* shows planes $(000\bar{1})$ and $(10\bar{1}1)$, FIG. 2*b* shows planes $(000\bar{1})$, $(10\bar{1}0)$ and $(10\bar{1}1)$, and FIG. 2*c* shows planes $(000\bar{1})$, $(10\bar{1}1)$, and (0001). The deposition planes shown are the natural faces of the beryllium oxide crystals on which single crystalline silicon have been deposited. Other natural facets, such as the $(20\bar{2}1)$ plane, have also been used.

The Miller-Bravis system of notation which is based on a hexagonal unit scale employs four numbers for designating a crystallographic plane and is used to designate the beryllium oxide planes. The National Bureau of Standards system of notation may also be used by replacing the third number of the Miller-Bravis system with a dot. The National Bureau of Standards system for indexing planes in BeO is set forth in NBS Circular 539, volume 1.

Silicon deposits of the composite of this invention have been obtained by high temperature thermal decomposition of silane and by the hydrogen reduction of silicon tetrachloride. The film could also be produced by the reduction and decomposition of other silicon halides or hydrides or by vacuum evaporation, or any other process in which a vapor transfer of elemental silicon to the beryllium oxide surface occurs or is in the final product. Such typical chemicals as trichlorosilane, silicon tetrabromide, and silicon tetraiodide may be used as silicon sources from which the film is deposited by reaction deposition.

Single crystalline deposits of varying uniformity are obtained on substrates which are relatively scratch-free, flat, and which are free from dust and other surface contaminants. Often a substrate surface is cleaned, such as by successively treating the surface with trichloroethylene, synthetic detergent solutions, distilled water, hydrochloric acid and a methyl alcohol rinse to prepare the substrate for single crystal silicon growth.

Conformation of single crystallinity of the film of the composites of the invention has been established by X-ray analysis using both the Laue back reflection technique and the full circle X-ray goniometer. The films do not separate from their substrates when the composites are flexed, indicative of an adherent chemical bonding of deposit to the substrate.

The term "single crystal" as used herein for referring to the single crystal silicon films and substrate of the composite of this invention is a generic term comprehending faults normally associated with crystals, such as for example microtwins, stacking faults, dislocations, and other imperfections.

The invention is hereinafter illustrated in greater detail by description in connection with the following examples;

EXAMPLE I

Figure 5:
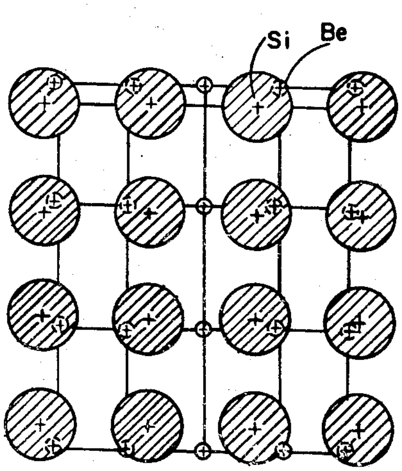
FIG. 5 is a crystallographic overlay of (100) silicon on $(10\bar{1}0)$ beryllium oxide.

A synthetic BeO crystal of about 0.15 inch diameter and 0.25 inch length, havng the form of a prism (see FIG. 2*a*) and a surface orientation of $(10\bar{1}0)$ normal to the gas stream was cleaned with successive washing treatments preliminary to having silicon deposited thereon. For deposition of a silicon film upon the substrate, it was placed upon a silicon pedestal in a reaction chamber, the pedestal being adapted to radio frequency (RF) heating. A spacer of aluminum oxide was positioned between the pedestal and the disc or substrate. The spacer served only to provide for uniform heating of the substrate and to prevent direct pickup of the silicon from the pedestal by the underside of the substrate. The beryllium oxide substrate was heated to the pedestal temperature of approximately 1275° C. (obs.) for a preliminary hydrogen etch. Hydrogen was purified by passage through a deoxidizer, molecular sieves and liquid nitrogen traps or a palladium-silver thimble and advanced through the reaction chamber at a rate of about 3 liters per minute for a period of about 25 minutes, whereupon the temperature of the pedestal supporting the beryllium oxide substrate was reduced to about 1175° C. The substrate was then covered with a thin film of silicon formed by the decomposition of a 0.2 mole percent silane in hydrogen mixture passed into the reactor for 30–60 seconds duration. Then a portion of the hydrogen gas (flow rate about 800 cc. per minutes) was diverted at a place upstream of the reaction chamber and bubbled through liquid silicon tetrachloride maintained at −45° C. The stream of hydrogen and silicon tetrachloride were combined with the mainstream of the hydrogen gas and passed through the reaction chamber. Flow of the mixture of hydrogen and silicon tetrachloride through the chamber was effected for a period of about 25 minutes. It was thereupon observed that a uniform film of about 10 microns thickness covered the exposed surface of the substrate. The film was examined by Laue back reflection techniques. This revealed one set of spots characteristic of (100) single crystal silicon superimposed upon one set of spots characteristic of $(10\bar{1}0)$ beryllium oxide. A crystallographic overlay of (100) silicon on $(10\bar{1}0)$ beryllium oxide is shown in FIG. 5. As shown therein, there is a crystallographic mismatch of approximately 5.7% in the [110] direction and approximately 12.7% perpendicular to the [110] rows.

EXAMPLE II

Figure 3:
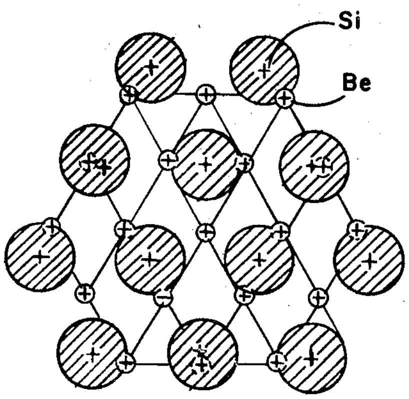
FIG. 3 is a crystallographic overlay of (111) silicon on (0001) beryllium oxide.

In Example II, the procedure of Example I was repeated except that (111) silicon was deposited on (0001) beryllium oxide. A crytallographic overlay of the deposition is shown in FIG. 3. The lattice sites shown therein coincide within 5.7% in orthogonal directions if a ratio of 2 silicons sites to 3 beryllium sites is considered.

EXAMPLE III

Figure 4:
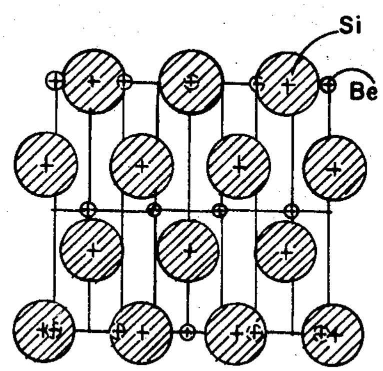
FIG. 4 is a crystallographic overlay of (111) silicon on $(10\bar{1}1)$ beryllium oxide.

The procedure of Example I was repeated except in this example, (111) silicon was deposited on $(10\bar{1}1)$ beryllium oxide. As shown in the crystallographic overlay in FIG. 4, the match is nearly perfect in one direction and 5.7% mismatched within [110] silicon rows.

EXAMPLE IV

Figure 6:
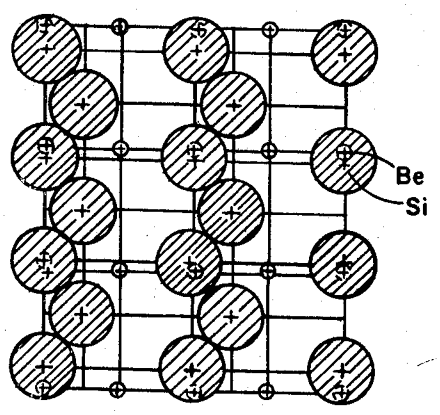
FIG. 6 is a crystallographic overlay of (110) silicon on $(10\bar{1}0)$ beryllium oxide.

The procedure of Example I was repeated except that (110) silicon was deposited on $(10\bar{1}0)$ beryllium oxide. FIG. 6 shows the crystallographic overlay of the silicon on the beryllium. The match is seen to be almost perfect in one direction and mismatched approximately 12.7% in the other direction.

The parallel directions in silicon and beryllium oxide have been determined to be the same in all cases studied except (110) silicon on $(10\bar{1}0)$ beryllium oxide, where [001] silicon is parallel to $[1\bar{2}10]$ beryllium oxide. The reason for the occurrence of either (100) or (110) silicon on $(10\bar{1}0)$ beryllium oxide has not been determined. However, it may be caused by flux impurities in certain of the beryllium oxide crystals which may distort the lattice in one direction enough to modify the silicon growth habit, or it may be related to deposition parameters. Epitaxy on the $(000\bar{1})(0^{-2})$ face have been suppressed by the high etching nature of this face or may be related to its particular polar character.

The crystallographic relationships between silicon and beryllium oxide are summarized in the following Table I.

TABLE 1.—ORIENTATION AND MISMATCH RELATIONSHIPS BETWEEN SILICON AND BeO

| | | Along [110] rows | | Between [110] rows | |
|---|---|---|---|---|---|
| Parallel Planes | Parallel Directions | Percent mismatch | (Si-Si):(Be-Be) spacing ratio | Percent mismatch | (Si-Si):(Be-Be) spacing ratio |
| (1) (111) Si‖$(10\bar{1}1)$ BeO | [110] Si‖$[1\bar{2}10]$ BeO | 5.7 | 2:3 | 0 | 3:4 |
| (2) (111) Si‖(0001) BeO (Be face) | [110] Si‖$[1\bar{2}10]$ BeO | 5.7 | 2:3 | 5.7 | 2:3 |
| (3) (100) Si‖$(10\bar{1}0)$ BeO | [110] Si‖$[1\bar{2}10]$ BeO | 5.7 | 2:3 | 12.7 | 1:1 |
| (4) (100) Si near $(20\bar{2}1)$ BeO | [110] Si‖$[1\bar{2}10]$ BeO | | | | |
| (5) (110) Si‖$(10\bar{1}0)$ BeO | [001] Si‖$[1\bar{2}10]$ BeO | 0 | 1:2 | 12.7 | 1:1 |

As shown in Table I, the $(20\bar{2}1)$ plane of BeO is not an ideal host for epitaxial growth of silicon. No low index silicon plane was determined which matches that beryllium plane. A high microtwin density found may be the result of a mismatch relief mechanism between the two densely packed beryllium oxide planes along the $[1\bar{2}10]$ zone. The planes along that zone are $(10\bar{1}0)$ which has produced (100) silicon, the $(10\bar{1}1)$ plane which produces (111) silicon, and half way between these, the epitaxial film of silicon on the $(20\bar{2}1)$ plane which is highly twinned so that both the (100) plane of the matrix and the (111) plane of the twinned matrix are nearly parallel to the substrate surface.

Although the invention has been described and illustrated in detail, it is to be understood that the same is by way of illustration and example only and is not to be taken by way of limitation; the spirit and scope of this invention being limited only by the terms of the appended claims.

I claim:

1. A process for epitaxially growing single crystalline silicon upon a substrate of crystalline beryllium oxide, the process comprising the steps of providing said substrate along a plane of the group consisting of (0001), $(10\bar{1}1)$, $(10\bar{1}0)$; exposing the surface to a high temperature decomposition of silane for deposition of silicon upon said substrate whereby single crystalline silicon will epitaxially grow upon the surface of said substrate.

2. A process for epitaxially growing single crystalline silicon upon a substrate of crystalline beryllium oxide, the process comprising the steps of providing said substrate along a plane of the group consisting of (0001), ($10\bar{1}1$), ($10\bar{1}0$); exposing the surface to a hydrogen reduction of silicon tetrachloride for deposition of silicon upon said substrate at an elevated temperature whereby single crystalline silicon will epitaxially grow upon the surface of said substrate.

3. A composite comprising a substrate of single crystal beryllium oxide and a film of single crystal silicon epitaxially disposed atop said substrate.

4. A composite according to claim 3 in which said substrate has an orientation of ($10\bar{1}0$) and said silicon has an orientation of (111).

5. A composite according to claim 1 in which said substrate has an orientation of (0001) and said silicon has an orientation of (111).

6. A composite according to claim 3 in which said substrate has an orientation of ($10\bar{1}1$) and said silicon has an orientation of (100).

7. A composite according to claim 3 in which said substrate has an orientation of ($10\bar{1}0$) and said silicon has an orientation of (110).

References Cited

UNITED STATES PATENTS

| | | | |
|---|---|---|---|
| 2,925,357 | 2/1960 | Kothen. | |
| 3,063,871 | 11/1962 | Barkemeyer et al. | |
| 3,373,051 | 3/1968 | Chu et al. | 117—201 X |

ALFRED L. LEAVITT, Primary Examiner

W. E. BALL, Assistant Examiner

U.S. Cl. X.R.

148—175

PO-1050
(5/69)

UNITED STATES PATENT OFFICE
CERTIFICATE OF CORRECTION

Patent No. 3,515,576 Dated June 2, 1970

Inventor(s) Harold M. Manasevit

It is certified that error appears in the above-identified patent and that said Letters Patent are hereby corrected as shown below:

Claim 4. The portion of Claim 4 reading "$(10\bar{1}0)$" should read --$(10\bar{1}1)$--.

Claim 6. The portion of Claim 6 reading "$(10\bar{1}1)$" should read --$(10\bar{1}0)$--.

SIGNED AND
SEALED
NOV 17 1970

(SEAL)
Attest:

Edward M. Fletcher, Jr.
Attesting Officer

WILLIAM E. SCHUYLER, JR.
Commissioner of Patents